United States Patent
Zhang et al.

(10) Patent No.: US 11,798,831 B2
(45) Date of Patent: Oct. 24, 2023

(54) METHOD FOR SUBSTRATE REGISTRATION AND ANCHORING IN INKJET PRINTING

(71) Applicant: Applied Materials, Inc., Santa Clara, CA (US)

(72) Inventors: Daihua Zhang, Los Altos, CA (US); Hou T. Ng, Campbell, CA (US); Nag B. Patibandla, Pleasanton, CA (US); Sivapackia Ganapathiappan, Los Altos, CA (US); Yingdong Luo, Newark, CA (US); Kyuil Cho, Santa Clara, CA (US); Han-Wen Chen, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/735,018

(22) Filed: May 2, 2022

(65) Prior Publication Data
US 2022/0336246 A1    Oct. 20, 2022

Related U.S. Application Data

(62) Division of application No. 16/838,999, filed on Apr. 2, 2020, now Pat. No. 11,322,381.
(Continued)

(51) Int. Cl.
*H01L 21/68*    (2006.01)
*H01L 21/67*    (2006.01)
*H01L 21/02*    (2006.01)

(52) U.S. Cl.
CPC ........ *H01L 21/68* (2013.01); *H01L 21/02288* (2013.01); *H01L 21/6715* (2013.01)

(58) Field of Classification Search
CPC ........... H01L 21/02288; H01L 21/6715; H01L 21/68
See application file for complete search history.

(56) References Cited

U.S. PATENT DOCUMENTS 9,067,299 B2 * 6/2015 Bajaj .................. B33Y 80/00
9,818,665 B2   11/2017 Elian et al.
(Continued)

FOREIGN PATENT DOCUMENTS

CN      104882418      9/2015
KR   10-2012-0034862   4/2012
(Continued)

OTHER PUBLICATIONS

International Search Report and Written Opinion in International Appln. No. PCT/US2020/039850, dated Oct. 20, 2020, 11 pages.
(Continued)

*Primary Examiner* — Mamadou L Diallo
(74) *Attorney, Agent, or Firm* — Fish & Richardson P.C.

(57) ABSTRACT

A method for printing on a substrate includes printing a support structure by printing a liquid precursor material and curing the liquid precursor material, positioning a substrate within the support structure, printing one or more anchors on the substrate and the support structure by printing and curing the liquid precursor material to secure the substrate to the support structure, and printing one or more device structures on the substrate while anchored by printing and curing the liquid precursor material.

15 Claims, 5 Drawing Sheets

Related U.S. Application Data

(60) Provisional application No. 62/868,645, filed on Jun. 28, 2019.

(56) References Cited

U.S. PATENT DOCUMENTS

| | | | |
|---|---|---|---|
| 11,322,381 B2 | 5/2022 | Zhang et al. | |
| 11,329,003 B2 | 5/2022 | Zhang et al. | |
| 11,367,643 B2 | 6/2022 | Zhang et al. | |
| 2004/0081416 A1 | 4/2004 | Akutsu et al. | |
| 2006/0068083 A1 | 3/2006 | Moon et al. | |
| 2011/0169893 A1 | 7/2011 | Takafuji | |
| 2011/0278736 A1 | 11/2011 | Lin et al. | |
| 2011/0304520 A1 | 12/2011 | Djordjevic et al. | |
| 2014/0230677 A1 | 8/2014 | Sanger | |
| 2015/0079301 A1* | 3/2015 | Nemani | C23C 18/145 427/508 |
| 2015/0249043 A1* | 9/2015 | Elian | B29C 70/72 264/294 |
| 2016/0093525 A1 | 3/2016 | Cook et al. | |
| 2017/0054078 A1* | 2/2017 | Vronsky | H01L 33/54 |
| 2017/0084882 A1* | 3/2017 | Vronsky | B05C 11/10 |
| 2017/0120416 A1* | 5/2017 | Chockalingam | B24B 37/22 |
| 2018/0036949 A1* | 2/2018 | Lopez | B29C 64/386 |
| 2018/0053702 A1 | 2/2018 | Spory | |
| 2019/0139788 A1 | 5/2019 | Fu et al. | |
| 2020/0269490 A1* | 8/2020 | Niimi | B29C 64/30 |
| 2020/0411312 A1 | 12/2020 | Zhang et al. | |
| 2020/0411351 A1 | 12/2020 | Zhang et al. | |
| 2020/0411447 A1 | 12/2020 | Zhang et al. | |
| 2022/0328336 A1 | 10/2022 | Zhang et al. | |

FOREIGN PATENT DOCUMENTS

| | | |
|---|---|---|
| KR | 10-2017-0103674 | 9/2017 |
| TW | 201733821 | 10/2017 |

OTHER PUBLICATIONS

Office Action in Taiwanese Appln. No. 109121428, dated Mar. 25, 2021, 10 pages (with English translation).

* cited by examiner

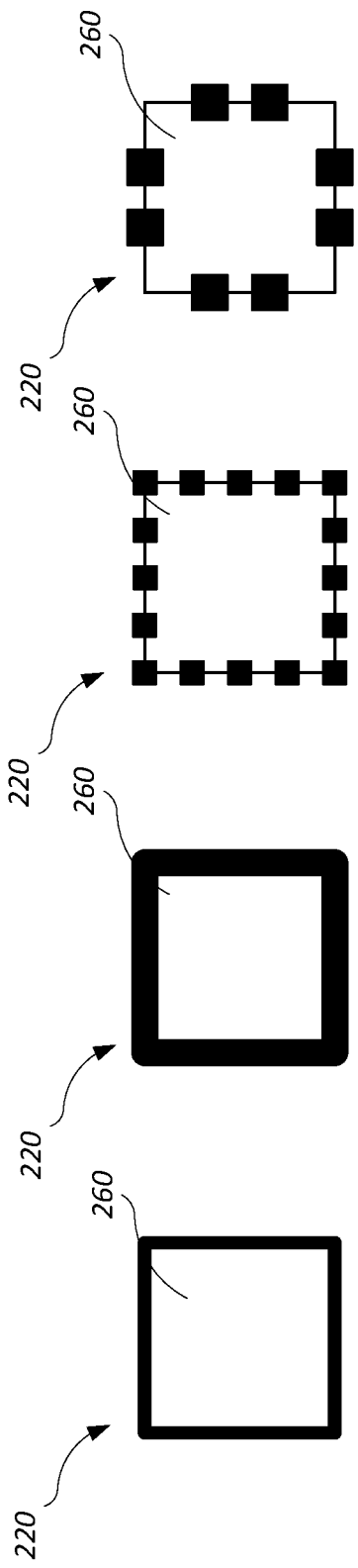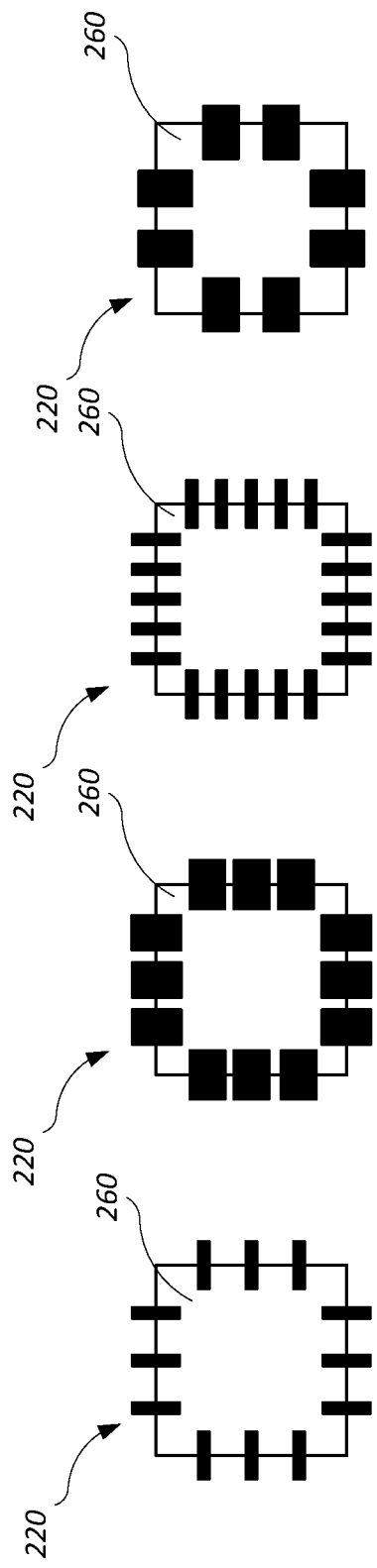

11,798,831 B2

METHOD FOR SUBSTRATE REGISTRATION AND ANCHORING IN INKJET PRINTING

CROSS-REFERENCE TO RELATED APPLICATIONS

This application is a divisional and claims priority to U.S. application Ser. No. 16/838,999, filed Apr. 2, 2020, which claims priority to U.S. Application Ser. No. 62/868,645, filed on Jun. 28, 2019, the disclosures of which are incorporated by reference.

TECHNICAL FIELD

This specification relates to deposition of material onto a substrate by inkjet printing.

BACKGROUND

Some semiconductor device and display fabrication steps require the selective deposition of a layer of material. Inkjet printing has been increasingly used in the semiconductor and display industries to deposit layers, especially in back-end processes that require lower resolution and positioning accuracy, such as passivation and packaging.

SUMMARY

In one aspect, a method for printing on a substrate includes printing a support structure by printing a liquid precursor material and curing the liquid precursor material, printing one or more alignment markers by printing the liquid precursor material outside the support structure and curing the liquid precursor material, positioning a substrate within the support structure, performing a registration of the substrate using the one or more alignment markers, and printing one or more device structures on the substrate while registered by printing and curing the liquid precursor material.

In another aspect, a method for printing on a substrate includes printing a support structure by printing a liquid precursor material and curing the liquid precursor material, positioning a substrate within the support structure, printing one or more anchors on the substrate and the support structure by printing and curing the liquid precursor material to secure the substrate to the support structure, and printing one or more device structures on the substrate while anchored by printing and curing the liquid precursor material.

Possible advantages may include, but are not limited to, one or more of the following.

Accuracy in alignment of the structures being printed to the substrate can be improved. Precise alignment can improve the precision and repeatability of depositing materials onto the substrates. Additionally, alignment of a substrate during a printing operation can be maintained using anchors to prevent the substrate from moving during the printing process. Maintaining the alignment of the substrate, e.g., in spite of mechanical vibrations of the printer or drifting of the printer and its sub-systems from an initial calibration, can improve the process of depositing materials on the substrate both during the process and over subsequent processes, thus increasing the precision and repeatability of the process.

The details of one or more implementations are set forth in the accompanying drawings and the description below.

Other aspects, features, and advantages will be apparent from the description and drawings, and from the claims.

BRIEF DESCRIPTION OF THE DRAWINGS

FIGS. 5A-5H are schematic top views of example anchor patterns.

DETAILED DESCRIPTION

Droplet ejection printing (also called inkjet printing even when the material being ejected is not being used as an ink) has been used to selectively deposit layers in semiconductor and display device manufacturing. An advantage of using inkjet printing for selective deposition is that a patterned layer can be deposited without the need for lithography, etching, liftoff, and high vacuum plasma deposition processes. Inkjet printing can offer great scalability, large throughput, low cost, and wide material gamut.

However, precise registration or alignment of the substrate on which the layer is to be printed (the "print substrate") with respect to the inkjet printer remains a problem. Typically, inkjet printers are not equipped with registration and alignment mechanisms for substrates with existing patterns, e.g., from previous process steps, and as such, precise registration and alignment of the substrate to the printer can be challenging. Additionally, the print substrate may slide, move, or rotate on a build platform due to mechanical vibrations during printing.

Such movement may not be an issue in conventional printing situations, but can be unacceptable for the level of accuracy needed in semiconductor and display device fabrication. One solution is to employ cameras and computer vision algorithms to monitor this movement and perform dynamic adjustments to the printing process, but this solution can be expensive, both in terms of cost for physical components and computational power needed for the dynamic control. A more efficient, economic, and reliable solution is to ensure proper alignment of the print substrate on the build platform with respect to the printheads by printing alignment marks with the printer onto the build platform. Alternatively or in addition, the print substrate can be anchored onto the build platform to prevent movement during the additive manufacturing process by printing further material.

Inkjet Printing Apparatus

Figure 1:
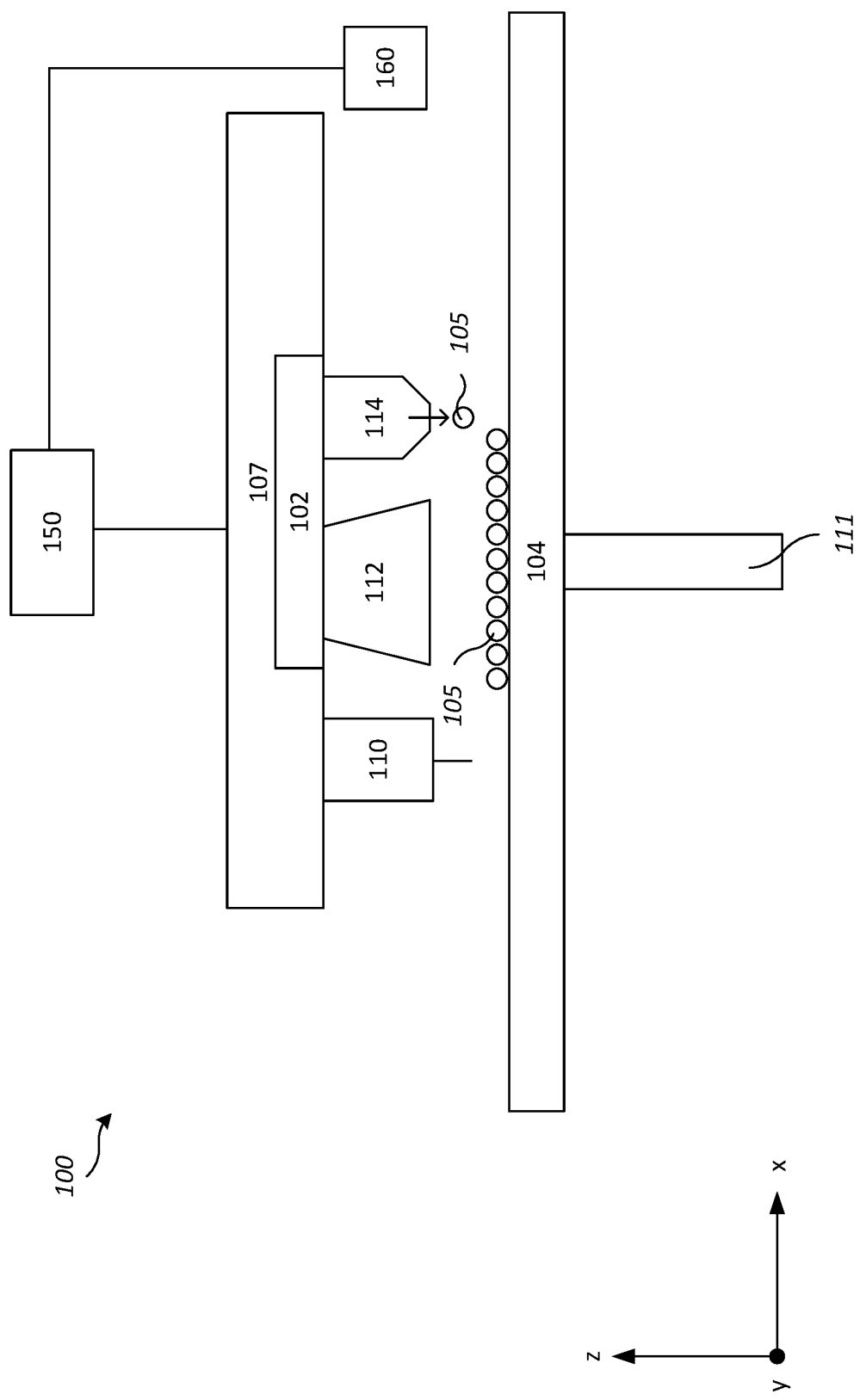
FIG. 1 is a schematic side view of an example of an additive manufacturing process.
Figure 2A:
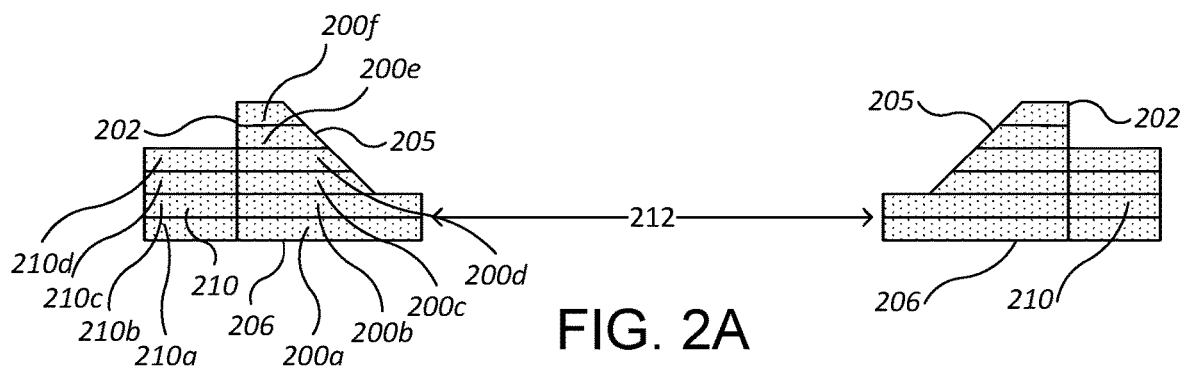
FIGS. 2A-2D are schematic side views of an example support structure.
Figure 2B:
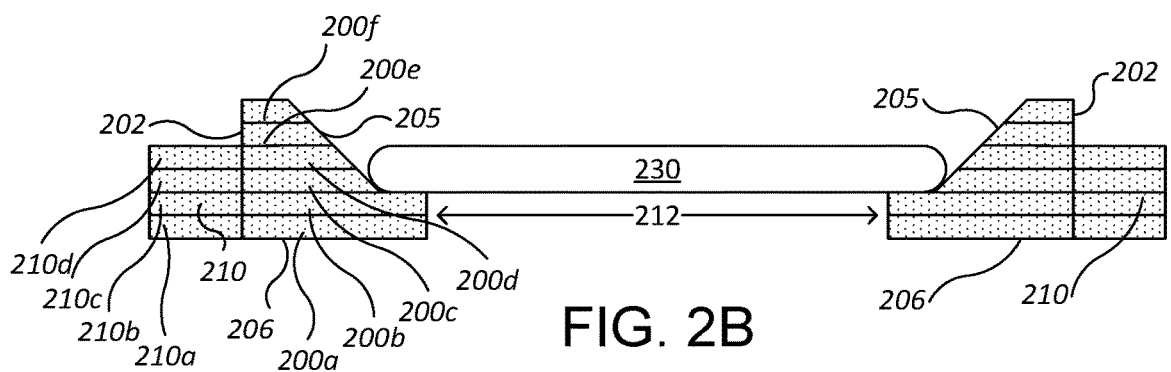
Figure 2C:
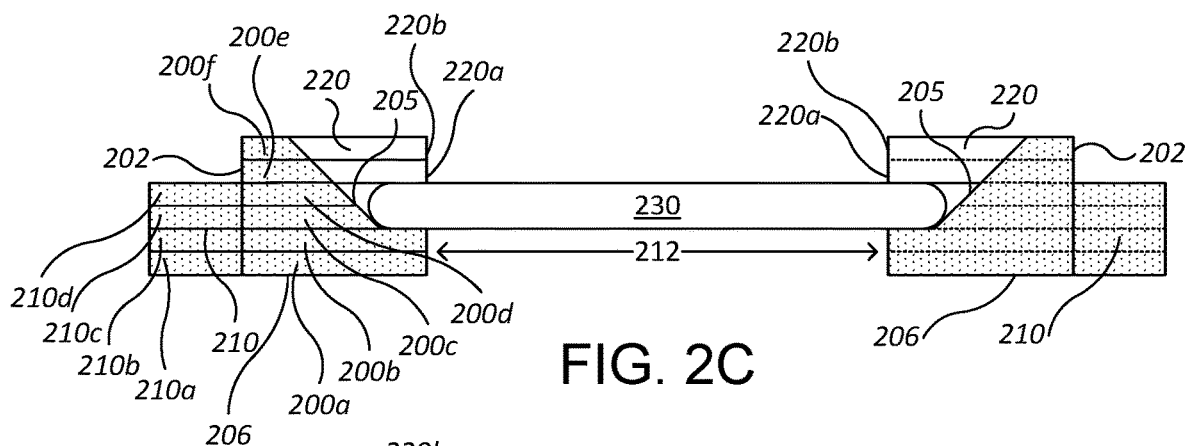
Figure 2D:
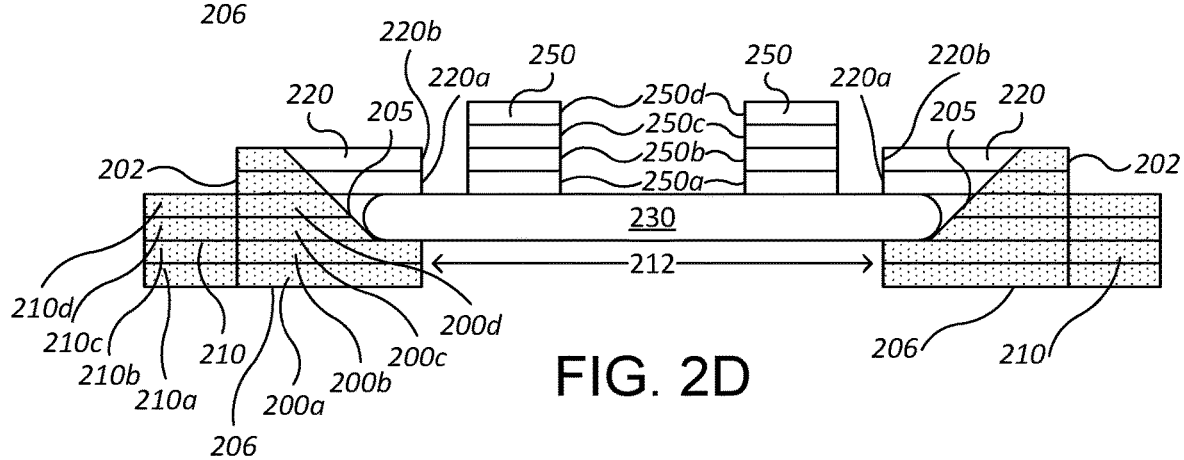

FIG. 1 shows a schematic side view of an example inkjet printing apparatus 100. The apparatus 100 can eject droplets of a liquid precursor 105 which can be solidified to form various structures, e.g., a support structure to hold the print substrate, alignment markers to ensure proper substrate positioning, anchors to secure the print substrate on the support structure or build platform or to secure dies on a reconstructed wafer, and/or layers, e.g., passivation layers, on the print substrate or dies on a reconstructed wafer.

The apparatus 100 includes a build platform 104 and a dispenser 114 to deliver the liquid precursor 105 onto the build platform 104 (i.e., either directly onto the platform, directly onto a print substrate on the platform, or onto a layer of cured material previously deposited by the dispenser on the platform or the print substrate).

A support 107, e.g., a gantry, holds one or more printheads 102 over the build platform 104. The printhead 102 can move in a plane above and parallel to the build platform 104 such that the printhead 102 can be selectively positioned above a usable area of the build platform 104. In particular, the support 107 is configured to traverse the build platform 104 in a first direction (e.g., along the x-axis).

In some implementations, the printhead 102 extends across the width of the build area of the build platform 104. In this case, movement of the printhead 102 in a second direction perpendicular to the first direction (e.g., along the y-axis) is not needed. In some implementations, the printhead 102 can also move along the support 107 in a second direction perpendicular to the first direction (e.g., along the y-axis). This may be used if the printhead 102 extends across only a portion of the width of the build area of the build platform 104. The same printhead 102 can be used to make multiple sweeps across the length of the build platform with each sweep covering a different portion of the width of the platform, e.g., a raster scan. The movement of the printhead 102 along the support 107 and the movement of the support 107 along the x-axis and y-axis provide multiple degrees of freedom for the printhead 102.

As the support 107 moves over the build platform 104, the dispenser 114 can selectively deposit the liquid precursor onto desired regions of the build platform 104, e.g., as controlled by a controller 150. The dispenser 114 can deliver the liquid precursor 105 as a layer of relatively uniform thickness.

For some build operations, e.g., fabrication of a support structure, the dispenser 114 can dispense successive layers of liquid precursor 105 onto the build platform 104. After or as each layer is dispensed (but before the next layer is dispensed), the layer can be solidified, e.g., cured. Each successive layer can be supported by the underlying layer of treated, e.g., cured, liquid precursor 105.

The liquid precursor 105 can be ejected from the dispenser 114 in the form of droplets. For example, the dispenser 114 can use inkjet printer techniques. The droplets of liquid precursor 105 ejected by the dispenser 114 can be uniform in size, or can vary in size. The precursor 105 can have a sufficiently high viscosity that it does not significantly spread when ejected onto the platform or previously cured layer.

Materials for the liquid precursor 105 can include polymer precursors, e.g., UV-curable polymer precursors. Examples include (meth)acrylate monomers, and can include one or more mono(meth)acrylates, di(meth)acrylates, a tri(meth)acrylates, tetra(meth)acrylates, or a combination thereof. Examples of suitable mono(meth)acrylates include isobornyl (meth)acrylate, cyclohexyl (meth)acrylate, trimethylcyclohexyl (meth)acrylate, diethyl (meth)acrylamide, dimethyl (meth)acrylamide, and tetrahydrofurfuryl (meth)acrylate. Monomers may serve as cross-linkers or other reactive compounds. Examples of suitable cross-linkers include polyethylene glycol di(meth)acrylates (e.g., diethylene glycol di(meth)acrylate or tripropylene glycol di(meth)acrylate), N,N'-methylenebis(meth) acrylamides, pentaerythritol tri(meth)acrylates, and pentaerythritol tetra (meth)acrylates. Examples of suitable reactive compounds include polyethylene glycol (meth)acrylates, vinylpyrrolidone, vinylimidazole, styrenesulfonate, (meth)acrylamides, alkyl(meth)acrylamides, dialkyl(meth)acrylamides), hydroxyethyl(meth)acrylate, morpholinoethyl acrylate, and vinylformamide. acrylates and acrylamide.

The dispenser 114 can selectively dispense a layer of precursor 105 on the build platform 104 such that some portions receive the precursor 105 and some portions do not receive the precursor 105. The dispenser 114 can have an array of openings through which flow of the liquid precursor 105 can be independently controlled, e.g., by independently controllable valves, or an array of piezoelectric ejectors that ejects the liquid precursor 105.

The precursor 105 can be treated, e.g., cured, to solidify and form a layer of the support structure 200. The precursor 105 can be treated using a first energy source 112, e.g., a light source that generates and directs light toward the liquid precursor material 105. In some implementations, the first energy source 112 is an ultraviolet (UV) light source. Additionally, the first energy source 112 can be supported on the printhead 102. The first energy source 112 can generate, for example, thermal radiation, UV radiation, IR radiation, and/or visible radiation. The first energy source 112 can direct light to a region that extends across an entirety of a width of the build area of the build platform 104. Motion of the printhead 102 or the support 107 can sweep this region across the length of the build area. The first energy source 112 can illuminate the entire region, including areas with and without liquid precursor 105.

The printhead 102 can be configured to support a second energy source 110. The second energy source 110 can be configured to direct energy to localized regions of the powder on the build platform 104. These regions can be as small as a few millimeters in diameter (e.g., using a point energy source) or to larger regions (e.g., using an area energy source). A point energy source can be, for example, a laser that emits a laser beam onto a small portion of the powder. An area energy source can be, for example, a lamp that emits light, e.g., infrared, visible or ultraviolet light.

In some implementations, the second energy source 110 can include a scanning laser that generates a beam of focused energy that increases a temperature of a small area of the precursor. The second energy source 110 can treat the precursor 105 using, e.g., a light source that generates and directs light toward the precursor 105. The first energy source 112 can generate, for example, thermal radiation, UV radiation, IR radiation, and/or visible radiation. In some cases, the second energy source 110 can include an ion beam or an electron beam. The second energy source can also include, for example, an array of lasers, e.g., laser diodes, an array of lamps, e.g., mercury lamps, that provide wide spectrum irradiation, or a solid-state infrared emitter array.

In some implementations, the second energy source 110 includes a plurality of light sources that can be independently activated. Each light source can be arranged in an array, e.g., a linear array, so as to provide selectable illumination along the primary axis of the strip. The second energy source can include, for example, light emitting diodes (LEDs), configured to emit radiation having an intensity dependent on a current delivered to the LEDs.

In some implementations, the second energy source 110 can be movable independent of the printhead 102. In some examples, the apparatus 100 can include a second energy source independent of the printhead 102 in addition to a second energy source 110 incorporated into the printhead 102. The apparatus 100 can also include several energy sources that are each addressable such that the controller 150 can precisely control the areas of the build platform 104 receiving energy.

The build platform 104 can be moved upward or downward relative to the dispenser 114 during build operations. For example, the build platform 104 can be moved downward after each layer of precursor 105 dispensed by the dispenser 114 so that the printhead 102 can remain at the same vertical height relative to the top of the with each successive layer dispensed.

Figure 3:
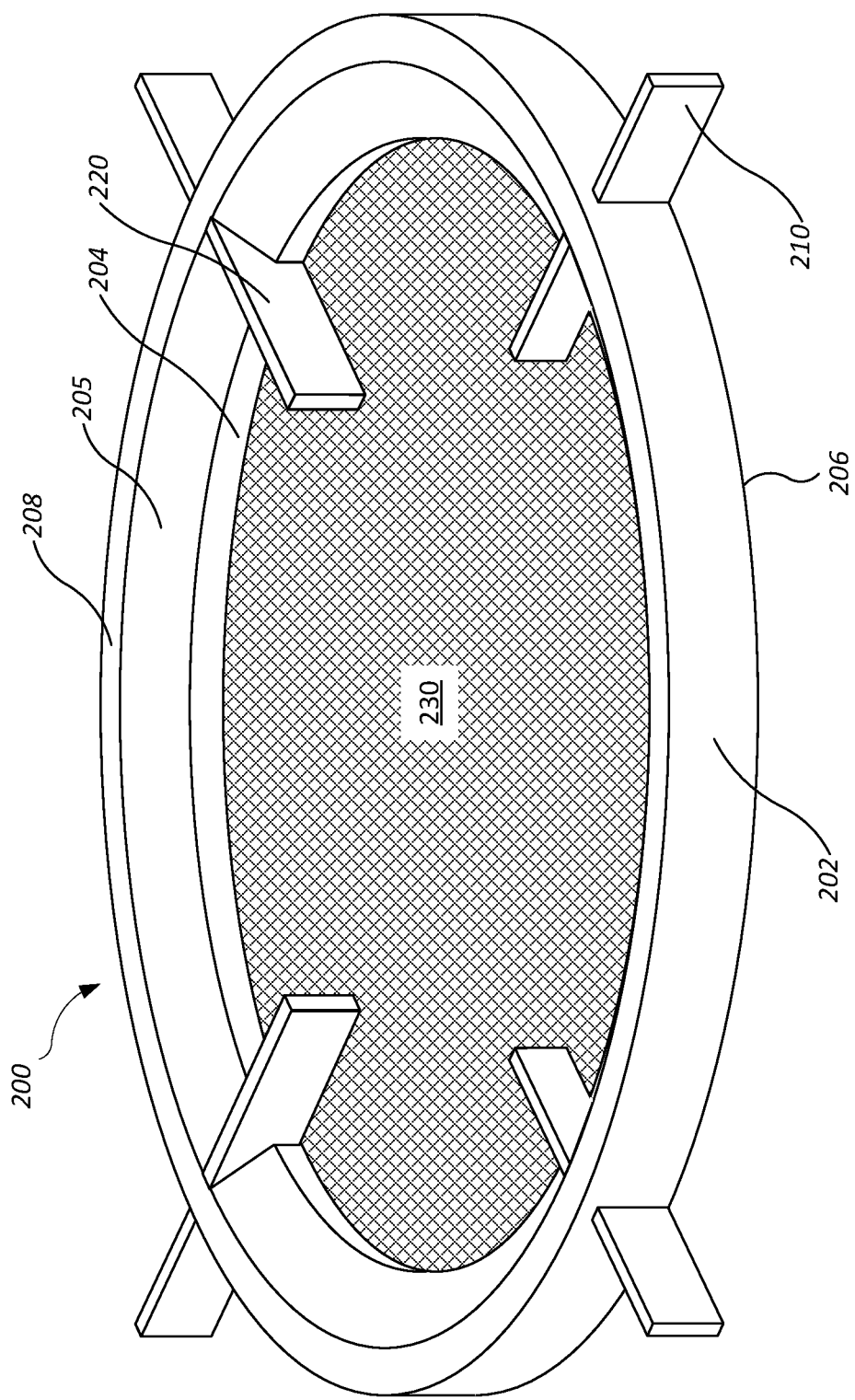
FIG. 3 is a perspective view of an example support structure.

After the build operation for an object is complete, the build platform 104 can be moved back up to an initial position in preparation for, for example, a cleanup or a build operation for a subsequent object, e.g., the support structure 200 (see FIG. 3).

Alternatively, the build platform 104 can be held in a fixed vertical position, and the support 107 can be raised after each layer is deposited.

To perform operations described herein, the apparatus 100 includes a controller 150 configured to control the operations of the sub-systems, including the dispenser 114, the first energy source 112, the second energy source 110, and the support 107. The controller 150 can include a computer aided design (CAD) system that receives and/or generates CAD data. The CAD data is indicative of the object (e.g., support structure 200, alignment markers 210, and anchors 220) to be formed, and, as described herein, can be used to determine properties of the structures formed during additive manufacturing processes. Based on the CAD data, the controller 150 can generate instructions usable by each of the systems operable with the controller 150, for example, to dispense the liquid precursor 105, to cure and solidify the precursor 105, to move various systems of the apparatus 100, and to sense properties of the systems, e.g., the cured and uncured liquid precursor 105.

A sensor 160 (e.g., a camera, scanner, or other metrology) can be configured to receive information about the properties of the liquid precursor 105, the support structure 200, and the substrate 230 (see FIGS. 2A-2D, 3, and 4). As will be discussed in more detail below, the sensor 160 can aid in determining proper alignment of the substrate 230 in the support structure 200, and the sensor 160 can be configured to communicate information about the various components and sub-components of the additive manufacturing apparatus to the controller 150.

Support Structure

Referring to FIGS. 2A-2D, 3, and 4, a support structure 200 is formed by the inkjet printing apparatus 100 on the build platform 104. As illustrated in FIG. 3, the support structure 200 can be an annular structure, e.g., a circular ring. The support structure 200 is formed from successive layers 200a, 200b, 200c, 200d, etc. After each successive layer of liquid precursor 105 is dispensed, it can be solidified to support another layer of liquid precursor 105 until the support structure 200 is formed.

The support structure 200 has an aperture 212 into which the substrate will fit (see FIGS. 2A-2D). Although FIG. 3 illustrates a circular aperture, in other implementations other shapes for the aperture can be suitable, depending on the shape of the substrate, such as a triangle, square or other geometric or complex shape.

In some implementations, the support structure 200 need not completely surround the region into substrate will fit. A support structure that partially surrounds the region, e.g., a number of unconnected arcs instead of the full circle as illustrated in FIG. 3, can be sufficient to support a substrate 230.

The support structure 200 is generally configured to tightly surround the substrate 230 (discussed below). The height of the support structure 200 (e.g., the height of the inner surface 204 that is in contact with the substrate 230) should be larger than the thickness of the substrate 230 to ensure the substrate 230 is fully contained within the support structure 230. A bottom surface 206 of the support structure 200 contacts and is supported by the build platform 104.

After the support structure 200 is formed (or alternatively, while the support structure 200 is being formed), one or more alignment markers 210 are formed by the inkjet printing apparatus 100. The alignment markers 210 are formed from one or more layers, e.g., successive layers 210a, 210b, 210c, 210d, etc. After each successive layer of liquid precursor 105 is dispensed, the layer can be treated by the first energy source 112 or the second energy source 110 to be solidified to support a subsequent layer of liquid precursor 105. The alignment markers 210 can be printed on the build platform 104.

In some implementations, the alignment markers 210 can be connected to an outer surface 202 of the support structure 200. In some implementations, the alignment markers can be connected to the top surface 208 of the support structure. The alignment markers 210 are used to aid the positioning and orientation of the substrate 230 to ensure a desired positioning or orientation within the support structure 200 (discussed below) during subsequent processes, such as subsequent inkjet printing processes in semiconductor and display industries. The alignment markers 210 can provide positioning accuracy of ±50 µm or below. This accuracy level can enable effective anchoring of the substrate 230 to the support structure 200 (discussed below).

The alignment markers 210 can be dots, stripes, rings, crosses, or other physical markers or indicators to help determine a positioning of the substrate 230 during loading of the substrate 230 (discussed below). In some implementations, the alignment markers 210 are radially extending strips; the center of the aperture 212 can provide the common origin for the radially extending strips.

After the alignment markers 210 are formed, a substrate 230 is loaded into the support structure 200. The substrate can be a semiconductor wafer used in fabrication of integrated circuits; the semiconductor wafer can have completed frontend processing and be ready to begin backend processing or already have undergone some backend processing.

The substrate 230 can be loaded to rest on the build platform 104 and be surrounded by the support structure 200 (e.g., be placed within the aperture 212). Alternatively, the substrate 230 can rest on a ledge, rim, the slope 205, top surface 208, or other portion of the support structure 200. The support structure 200 can include a chamfered slope 205. The chamfered slope 205 from the top surface 208 to the inner surface 204 can guide the positioning of the substrate 230, e.g., the substrate 230 can slide into position along the chamfered slope 205.

The alignment markers 210 can serve as a visual indicia of the substrate 230 position within the support structure 200. The sensor 160, e.g., a camera that is in a fixed position relative to the build platform 104, can be used to figure out the substrate 230 offset. For example, the camera can be used to determine the position of the alignment markers 210 in a camera image. In particular, the controller 150 can perform an image recognition algorithm to determine the position of the alignment markers 210 in the camera image. This determined position can be compared to a default or predetermined position for the alignment markers 210 and a first offset can be calculated. The first offset can be a simple translation, or a more complex transformation such as a skew or rotation. Printing by the printhead 102 can accommodate for the first offset of the alignment markers 210 (as measured by the camera and the controller) against the default or predetermined position of the alignment markers 210.

The camera (e.g., the sensor 160) can be used to further determine the position of the substrate 230 within the support structure 200. In particular, the controller 150 can perform an image recognition algorithm to determine the position of the substrate 230 in the camera image. The position of the substrate 230 in the camera image can be compared to a default or predetermined position of the substrate 230 and a second offset can be calculated. The second offset can be a simple translation, or a more complex transformation such as a skew or rotation. Printing by the printhead 102 can then accommodate for the second offset of the substrate 230.

The control signals from the controller 150 can then be generated to take into account the offset of the alignment markers 210 and the offset of the substrate 230. In particular, an appropriate transforms can be applied to the image data for the layer(s) to be printed such that printing of features on the substrate 230 take into account the offset of the alignment markers 210 and the offset of the substrate 230.

Once the substrate 230 is placed within the support structure 200, the substrate 230 is secured within the support structure 200 to prevent movement during subsequent processes. In some implementations, the substrate 230 is secured to the build platform 104 using an adhesive to provide additional bonding between the substrate 230 and the underlying build platform 104 to help secure the substrate 230 to the underlying build platform 104 to reduce movement during subsequent processes. In some implementations, the substrate 230 is secured to the support structure using an adhesive to provide additional bonding, and reduce movement during subsequent processes. Additionally, the support structure 200 can be fixed to the build platform 104 by an adhesive to reduce movement of the support structure 200 during subsequent processes. The adhesive can be a polyacrylate-based, polydimethylsiloxane-based, or polyurethane based adhesive.

In addition or as an alternative to an adhesive, referring to FIGS. 2C-2D, 3, and 4, one or more anchors 220 are formed by the inkjet printing apparatus 100. The anchors 220 are formed from one or more layers, e.g., successive layers 220a, 220b, etc. After each successive layer of liquid precursor 105 is dispensed, it can be treated by the first energy source 112 or the second energy source 110 to be solidified to support a subsequent layer of liquid precursor 105.

The anchors 220 are formed on the substrate 230 and on the support structure 200 and/or build platform 104. In particular, the anchors 220 extend across the edge of the substrate 230 and bond to the surrounding underlying surface, e.g., the top surface or canted surface of the support structure 200. The anchors 220 can be, for example, dots, strips, or frames along the edge of the substrate 230 that connect the substrate 230 to the support structure 200. The anchors 220 can further reduce or prevent the substrate 230 from shifting within the support structure 200 during subsequent processes, e.g., subsequent inkjet printing processes.

The contact area and thickness of the anchors 220 on the substrate 230 should be sufficiently small that the anchors can be debonded from the substrate substantially without danger of damage after completion of the printing process. For example, the contact area can have a width between 0.5 and 2 mm, and the thickness of the anchors 220 can be 0.2 to 1 mm. The total contact area for the anchors can be less than 1% of the surface area of the substrate 230, e.g., less than 0.5%, e.g., less than 0.1%.

After the substrate 230 is anchored to the support structure 200, one or more print layers 250 are formed by the inkjet printing apparatus 100. The print layers 250 are formed from one or more layers, e.g., successive layers 250a, 250b, 250c, 250d, etc. After each successive layer of liquid precursor 105 is dispensed, it can be treated by the first energy source 112 or the second energy source 110 to be solidified to support a subsequent layer of liquid precursor 105. The print layers 250 can be, for example, layers for passivation or packaging.

In some implementations, the print layer 250 to form the devices on the substrate 230 is formed of the same liquid precursor 105 as is used to form the support structure 200 and/or the anchors 220. In particular, the liquid precursor to form the print layers 250 can be ejected from the same nozzles that are used for the support structure 200 and/or the anchors 220. This ensures that the alignment or registration that was previously performed is maintained for the devices on the substrate 230.

However, in some implementations, the liquid precursor that is ejected to form the print layers 250 to form the devices has a different composition than the liquid precursor that is ejected to form the support structure 200 and/or the anchors 220. However, a danger here is that different material properties of the liquid precursors can result in different ejection characteristics, e.g., velocity, flight time, angle. So using the same material for both the print layers 250 and the support structure 200 and/or the anchors 220 has greater reliability for the alignment and registration.

In some approaches, the nozzles can be purged, and then the same nozzles that are used for the support structure 200 and/or the anchors 220. Alternatively, the liquid precursor to form the print layers 250 can be ejected from a different set of nozzles on the same printhead 102 or different printhead on the same support 107, such that an adjustment to position performed for the support 107 based on the alignment or registration is applicable for the different set of nozzles. However, a danger here is that the different nozzles will have slightly different configurations, which can in turn affect the ejection characteristics, e.g., velocity, flight time, angle. So using the same nozzles for both the print layers 250 and the support structure 200 and/or the anchors 220 has greater reliability for the alignment and registration.

The controller 150 and other computing devices part of systems described herein can be implemented in digital electronic circuitry, or in computer software, firmware, or hardware. For example, the controller can include a processor to execute a computer program as stored in a computer program product, e.g., in a non-transitory machine readable storage medium. Such a computer program (also known as a program, software, software application, or code) can be written in any form of programming language, including compiled or interpreted languages, and it can be deployed in any form, including as a standalone program or as a module, component, subroutine, or other unit suitable for use in a computing environment.

The controller 150 and other computing devices part of systems described can include non-transitory computer readable medium to store a data object, e.g., a computer aided design (CAD)-compatible file that identifies the pattern in which the feed material should be deposited for each layer. For example, the data object could be a STL-formatted file, a 3D Manufacturing Format (3MF) file, or an Additive Manufacturing File Format (AMF) file. For example, the controller could receive the data object from a remote computer. A processor in the controller 150, e.g., as controlled by firmware or software, can interpret the data object received from the computer to generate the set of signals necessary to control the components of the apparatus 100 to fuse the specified pattern for each layer.

Figure 4:
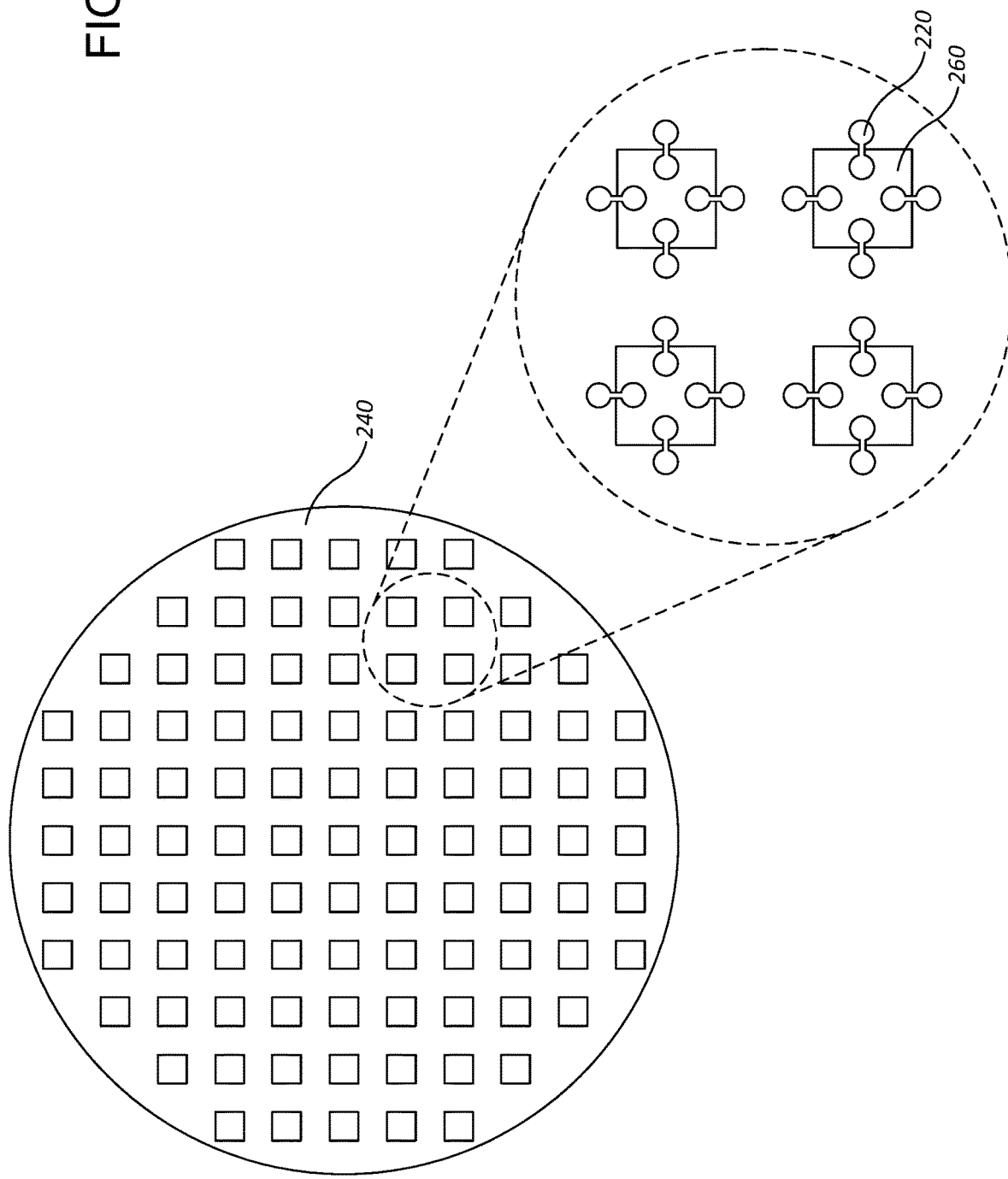
FIG. 4 is a schematic top view of example anchored dies on a reconstructed wafer.

Referring to FIG. 4, anchors 220 can be used to bond an array of individual dies 260 to a base substrate (e.g., the substrate 230) to form a reconstructed wafer 240—a wafer with an array of individual dies attached to its surface for subsequent processing. FIGS. 5A-5H illustrate various patterns and configurations for the anchors 220 (assuming a square die 260). The anchors can take various forms such as continuous frames (see FIGS. 5A and 5B), dots (see FIGS. 5C and 5D), strips (see FIGS. 5E-5H), or a combination thereof. The anchors 220 secure the dies 260 (e.g., the substrate 230) to the underlying reconstructed wafer 240.

The dimensions of the anchors 220 can be selected as necessary to provide a desired degree of anchoring. For example, the anchors 220 can have a thin profile (as in FIG. 5E) to reduce the area on the substrate 230 that the anchors 220 occupy to facilitate debonding. Alternatively, when a process requires stronger anchoring, a configuration such as FIG. 5B or 5F can be used to anchor the substrate 230 to the support structure 200.

While this document contains many specific implementation details, these should not be construed as limitations on the scope of any inventions or of what may be claimed, but rather as descriptions of features specific to particular embodiments of particular inventions. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The printhead of FIG. 1 includes several systems that enable the apparatus 100 to build objects. In some cases, instead of a printhead, an AM apparatus includes independently operated systems, including independently operated energy sources, dispensers, and sensors. Each of these systems can be independently moved and may or may not be part of a modular printhead. In some examples, the printhead includes only the dispensers, and the apparatus include separate energy sources to perform the fusing operations. The printhead in these examples would therefore cooperate with the controller to perform the dispensing operations.

A number of implementations have been described. Nevertheless, it will be understood that various modifications may be made. Various components described above as being part of the printhead, such as the dispenser(s), spreader(s), sensing system(s), heat source and/or energy source, can be mounted on the gantry instead of in the printhead, or be mounted on the frame that supports the gantry. Accordingly, other implementations are within the scope of the claims.

What is claimed is:

1. A substrate registration/alignment apparatus, comprising:
   a droplet ejection printer; and
   a controller configured to cause the droplet ejection printer to
   print a support structure by printing a liquid precursor material and curing the liquid precursor material,
   print one or more anchors on the substrate and the support structure by printing and curing the liquid precursor material to secure the substrate to the support structure, and
   print one or more device structures on the substrate by printing and curing the liquid precursor material while the substrate is anchored and registered.

2. The apparatus of claim 1, wherein the controller is configured to cause the droplet ejection printer to print anchors that extend across an edge of the substrate.

3. The apparatus of claim 2, wherein the controller is configured to cause the droplet ejection printer to print anchors that comprise dots, strips, or frames.

4. The apparatus of claim 1, wherein the controller is configured to cause the droplet ejection printer to print a support structure having a circular aperture into which the substrate fits.

5. The apparatus of claim 4, wherein the controller is configured cause the droplet ejection printer to print anchors that comprise strips extending along radial segments that have a center of the aperture as an origin.

6. The apparatus of claim 1, wherein the controller is configured to cause the droplet ejection printer to print the support structure with a chamfered interior surface.

7. The apparatus of claim 1, wherein the controller is configured cause the droplet ejection printer to print alignment markers that extend from the support structure.

8. The apparatus of claim 7, wherein the controller is configured cause the droplet ejection printer to print alignment markers as angularly aligned with the one or more anchors.

9. The apparatus of claim 1, wherein the controller is configured to cause the droplet ejection printer to print and cure a layer of the liquid precursor material as passivation or packaging for integrated circuit dies on a semiconductor wafer.

10. The apparatus of claim 9, wherein the controller is configured to cause the droplet ejection printer to print one or more anchors on the substrate and the support structure by printing and curing the liquid precursor material to secure the substrate to the support structure.

11. A substrate registration/alignment apparatus, comprising:
    a droplet ejection printer; and
    a controller configured to cause the droplet ejection printer to
    print a support structure by printing a liquid precursor material and curing the liquid precursor material, wherein the support structure is an annular body having an aperture into which a substrate fits, and
    print one or more device structures on the substrate by printing and curing the liquid precursor material while the substrate is anchored and registered.

12. The apparatus of claim 11, wherein the controller is configured to print the support structure as a full circle.

13. The apparatus of claim 11, wherein the controller is configured to print the support structure as a plurality of unconnected arcs.

14. The apparatus of claim 11, wherein the controller is configured to cause the droplet ejection printer to print the support structure with a chamfered interior surface.

15. The apparatus of claim 11, wherein the controller is configured to cause the droplet ejection printer to print and cure a layer of the liquid precursor material as passivation or packaging for integrated circuit dies on a semiconductor wafer.

* * * * *